United States Patent [19]

Freyre et al.

[11] Patent Number: 4,460,250

[45] Date of Patent: Jul. 17, 1984

[54] ACOUSTO-OPTICAL CHANNELIZED PROCESSOR

[75] Inventors: Frederick W. Freyre, Wantagh; Richard LaRosa, South Hempstead, both of N.Y.

[73] Assignee: Hazeltine Corporation, Commack, N.Y.

[21] Appl. No.: 274,611

[22] Filed: Jun. 17, 1981

[51] Int. Cl.$^3$ .............................................. G02F 1/11
[52] U.S. Cl. ................................... 350/358; 350/371; 350/96.13
[58] Field of Search ..................... 350/358, 371, 96.13, 350/96.14

[56] References Cited

U.S. PATENT DOCUMENTS 3,544,795  12/1970  Korpel ............................. 350/358
4,332,441  6/1982  Margolis .......................... 350/358

Primary Examiner—William L. Sikes
Assistant Examiner—Leon Scott, Jr.
Attorney, Agent, or Firm—E. A. Onders; F. R. Agovino

[57] ABSTRACT

Coherent light is incident upon an acousto-optical cell through which bulk acoustic waves are propagating. These acoustic waves correspond to a signal to be detected and cause periodic variations in the refractive index of the cell which interact with the coherent light. Acoustic frequency components of the propagating waves cause the cell to diffract beams of incident coherent light in a unique direction and to frequency shift each beam of diffracted light. The relative phases of the acoustic frequency components are also imparted to the respective diffracted light beams. Diffracted and undiffracted coherent light beams are recombined so that optical heterodyning takes place. The recombined light beams are focused by a Fourier Transform lens onto a photomixer which detects the frequency difference between the diffracted and undiffracted light beams. By detecting the recombined light beams with a photomixer array or, by deflecting the position of the undiffracted light or by amplitude or phase modulating the undiffracted light, a channelized coherent acousto-optical receiver is achieved which may function as part of a rapidly tunable bandpass filter.

10 Claims, 7 Drawing Figures

ACOUSTO-OPTICAL CHANNELIZED PROCESSOR

BACKGROUND OF THE INVENTION

1. Field of the Invention

The invention relates generally to optical heterodyning systems and, in particular, to a channelized coherent acousto-optical receiver. The invention also relates to acousto-optical receiver employing beam translators as disclosed in Serial No. 274,577 filed on June 17, 1981 concurrently herewith and incorporated herein by reference.

2. Description of the Prior Art

Optical heterodyning is known in the prior art. For example, U.S. Pat. No. 4,097,110 describes a depolarization measurement by optical heterodyning. A signal component polarized in one direction and a frequency shifted local oscillator component polarized in the same direction are formed from reference and signal components of an incident beam. These components are optically heterodyned at a detector.

SUMMARY OF THE INVENTION

It is an object of this invention to provide a channelized coherent acousto-optical receiver which may function as a rapidly tunable bandpass filter.

The channelized coherent acousto-optical receiver according to the invention detects RF components of an input signal. The detector includes means for converting the input signal into corresponding acoustic waves propagating through a medium and means for optically detecting the frequency components of the corresponding acoustic waves. In particular, a source provides coherent light which is incident upon an acousto-optical cell having a transducer and an absorber. The input signal to be detected is applied to the transducer and converted to a corresponding bulk acoustic wave in the cell. Light diffracted by the acoustic wave is focused by a Fourier Transform lens along with undiffracted light onto a detector which detects the frequency difference between the diffracted and undiffracted light.

For a better understanding of the present invention, together with other and further objects, reference is made to the following description, taken in conjunction with the accompanying drawings, and its scope will be pointed out in the appended claims.

DETAILED DESCRIPTION OF THE INVENTION

Figure 1B:
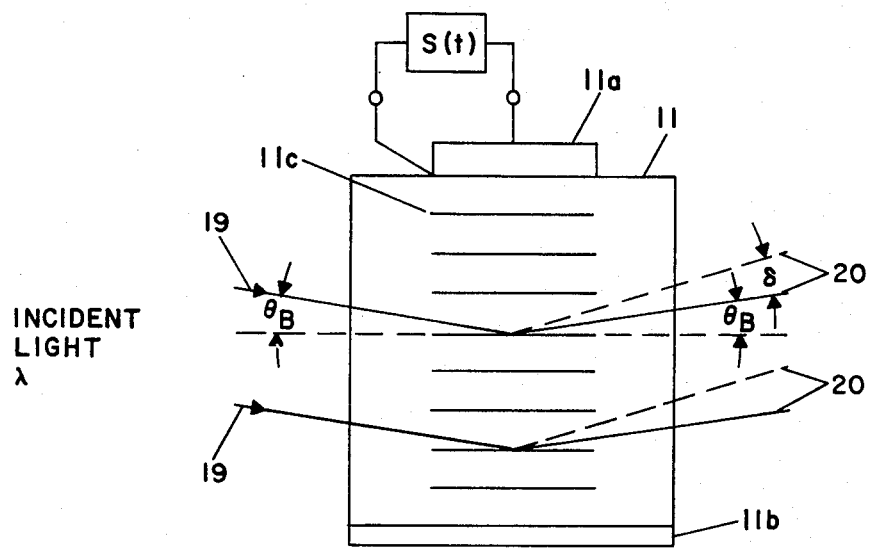
FIG. 1B illustrates the acousto-optical properties of the cell of the receiver shown in FIG. 1A.
Figure 1A:
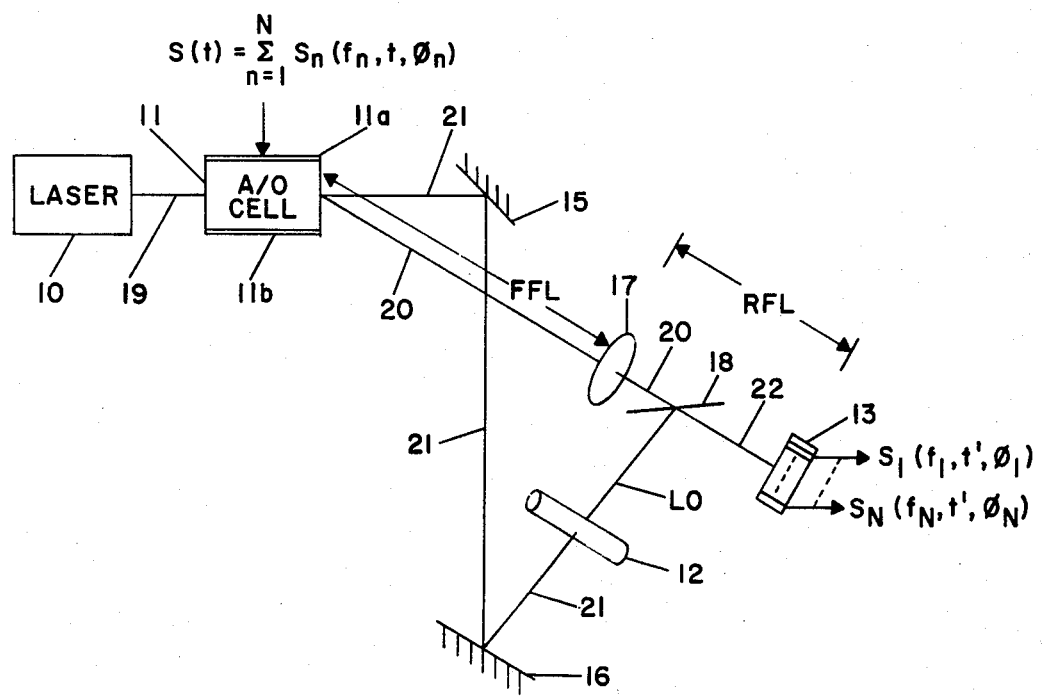
FIG. 1A is a diagram optically illustrating a channelized coherent acousto-optical receiver according to the invention using a photodetector array.

A preferred embodiment of the invention is illustrated schematically in FIG. 1A including a continuous wave laser 10, acousto-optical cell 11, Fourier Transform (FT) lens 17, linear photomixer array 13 and beam shaping optics including mirrors 15, 16, cylindrical lens 12 and beam splitter 18. In the general case, input signal S(t) to be detected is a super-position of RF signals $s_1$, . . . $s_N$ having respective amplitudes, bandwidths and phases. In the simplest case, there is a single RF input signal applied to the acousto-optical cell 11.

Preferably, the acousto-optical cell 11 illustrated in FIG. 1B is a Bragg cell having a broadband transducer 11a which converts the RF components of input signal S(t) applied to transducer 11a into corresponding acoustic frequency components with no amplitude or phase distortion. The acoustic frequency components propagate at acoustic velocity $V_a$ non-dispersively as acoustic shear waves 11c through the acousto-optical medium of cell 11 and are absorbed by absorber 11b. These acoustic waves cause periodic variations in the refractive index of the acousto-optical medium of cell 11 which interact with the coherent light 19 provided by laser 10 and incident on the medium of cell 11 at a Bragg angle $\theta_B$ of the medium. As a result of these periodic variations, each corresponding acoustic frequency component of the RF input signal S(t) causes the acousto-optical cell 11 to diffract a beam of incident coherent light 19 in a unique direction and to frequency shift each beam of diffracted light 20. The magnitude of the diffraction angle $\theta_B \pm \delta$ of each of the beams of diffracted light 20 is proportional to the acoustic frequencies corresponding to the RF components of the input signal S(t). (Refraction of the light as it enters and exits cell 11 also occurs but is not shown for simplification. The frequency shift of each of the beams of diffracted light 20 is equal to the acoustic frequency corresponding to each RF component of the input signal S(t). The relative phases of the acoustic frequency components are also imparted to their respective diffracted light beams 20. Since the relative phases of the acoustic frequency components correspond to the phases of the RF components, the result is that the relative phase of each of the RF components of input signal S(t) is imparted onto its corresponding diffracted light beam 20.

A Fourier Transform (FT) element, such as a mirror or spherical FT lens 17, focuses each diffracted beam 20 through beam splitter 18 and onto the linear photomixer array 13. The distance between FT lens 17 and array 13 is equal to the rear focal length RFL of the lens 17. Each photomixer of array 13 collects light diffracted by FT lens 17 within a particular frequency band. The frequency bands may be equally wide and contiguous or slightly overlapping.

Simultaneously, undiffracted light 21 is shaped into a uniform sheet beam by reflection incident on mirrors 15, 16 and by refraction through cylindrical lens 12. This results in a beam of light which functions as a local oscillator beam LO. This local oscillator beam LO is reflected by beam splitter 18 and illuminates each section of photomixer array 13. As a result, heterodyning takes place and each section detects the frequency and phase of the portion of composite beam 22 incident thereon. The output of each section is proportional to the difference frequency between the diffracted beam 20 and undiffracted local oscillator beam LO forming composite beam 22. Beams 20 and LO are superimposed highly parallel to each other, normal to the detector surface of the photomixer array 13, and polarized in the same direction. Therefore, an RF output component corresponding to the difference frequency of the light beams is output by each of the photomixer sections of array 13. This RF output component corresponds to the RF signals $s_1 \ldots s_N$ of input signal S(t) which are within the frequency band of each section of photomixer 13.

The linear photomixer array 13 may be comprised of 1-100 channels or photodetectors with from 0.1 to 10 MHz bandwidths. The filter response curve of array 13 is dependent upon the incident optical beam shape and size, RF frequency, focal length of the FT element, detector size and spacing, optical wavelength and acoustic beam velocity. The acoustic transducer 11a, acoustic medium of cell 11 and photomixer sections of array 13 must have sufficient bandwidths to accommodate the overall device bandwidth.

Acousto-optical cell 11 may employ any of the various types of acousto-optical interaction known in the prior art. In a preferred embodiment, acousto-optical cell 11 is a Bragg cell characterized by a large interaction efficiency with a sinusoidal characteristic, a single diffraction order, and an angular alignment requirement. Alternatively, a Debye-Sears diffraction cell may be used, characterized by a lesser but linear interaction efficiency, and multiple diffraction orders with Bessel function distribution. The relative geometry of the acoustic waves and light and the acoustic wavelength determine the type of acousto-optical interaction.

The diffracted light exiting the acousto-optical medium of cell 11 is amplitude and phase modulated by the bulk acoustic waves launched through cell 11 by transducer 11a and absorbed by absorber 11b. If the distance between the acoustic cell 11 and the spherical FT lens 17 is equal to the front focal length FFL of lens 17, the complex Fourier Transform of the phase modulations convolved with the Fourier Transform of the aperture function will be formed at the back focal plane of lens 17. The aperture of lens 17 is sufficiently large, so that this convolution will be a good approximation of the modulation Fourier Transform.

The undiffracted light 21 (O order) is shaped into a sheet beam as the local oscillator beam LO by cylindrical lens 12 and is reflected by beam splitter 18 to illuminate photomixer array 13. The diffracted and undiffracted beam wave fronts of composite beam 22 are highly parallel for optimum photomixing. Additionally, the beams are normally incident and similarly polarized. At the rear focal plane of FT lens 17 the relative phases of the diffracted beams will equal the relative phases of the input signal components. If array 13 is precisely located at the back focal plane, the RF output current of the nth section of array 13 corresponding to the nth frequency component of the input signal may be expressed as follows:

$$I_n(rf) = A \cos(\phi_n t + \Omega_n - \phi_{LO})$$

where:
$\Omega_n$ = RF frequency
$\phi_n$ = phase of RF frequency
$\phi_{LO}$ = phase of LO beam This equation indicates that the RF current is at the difference frequency and the difference phase of the diffracted beam 20 and the undiffracted beam 21. A feedback controlled variable optical path or other electro-optical device in the path of the local oscillator LO may be needed to prevent drifting of the phase of the local oscillator.

For sufficient power in local oscillator beam LO, heterodyne receiver noise is dominated by local oscillator induced shot or generation-recombination noise. In the apparatus as illustrated in FIG. 1A, the thermal noise of the detector, load and amplifier and background and dark current noise becomes small. Therefore, this type of detection allows realization of an optical receiver with wide bandwidth and high sensitivity approaching the theoretical quantum noise limit, thereby allowing high resolution and dynamic range.

RAPIDLY TUNABLE BANDPASS FILTER EMBODIMENTS

Figure 2A:
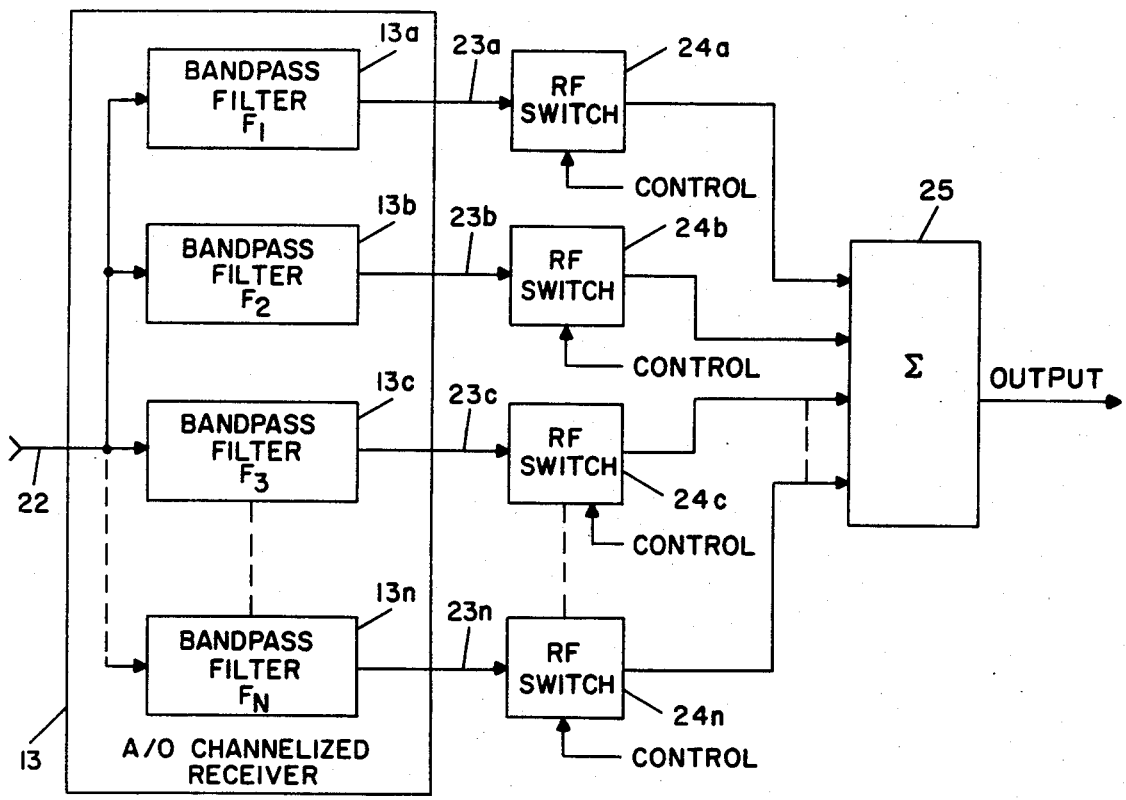
FIG. 2A is a block diagram illustrating a rapidly tunable bandpass filter according to the invention using RF circuitry.
Figure 2B:
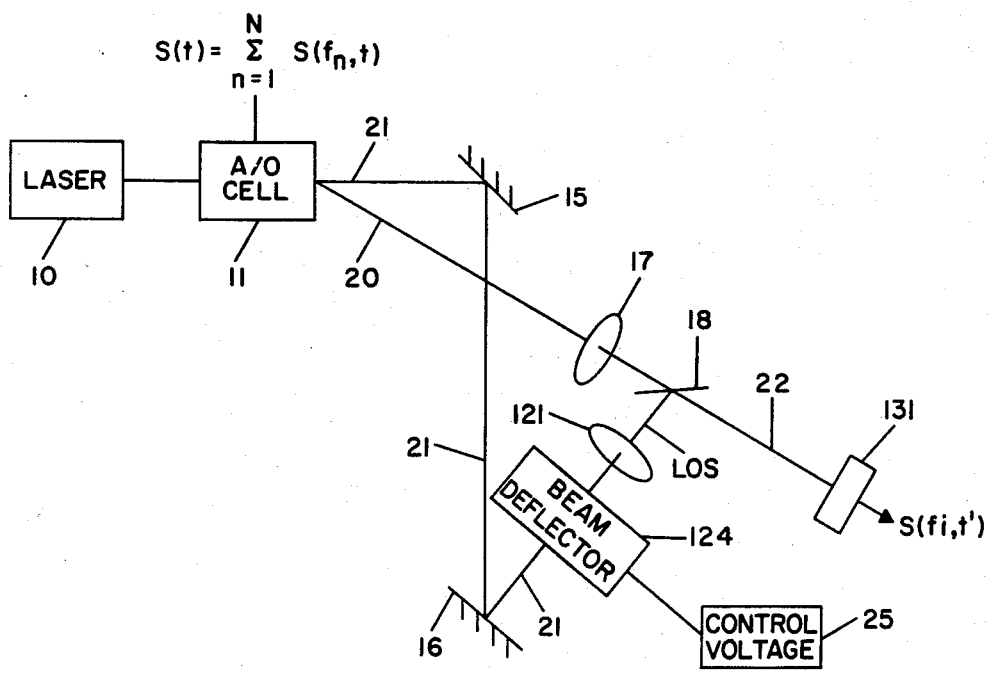
FIG. 2B is a block diagram optically illustrating an alternative embodiment of a rapidly tunable bandpass filter according to the invention using a beam deflector.
Figure 2C:
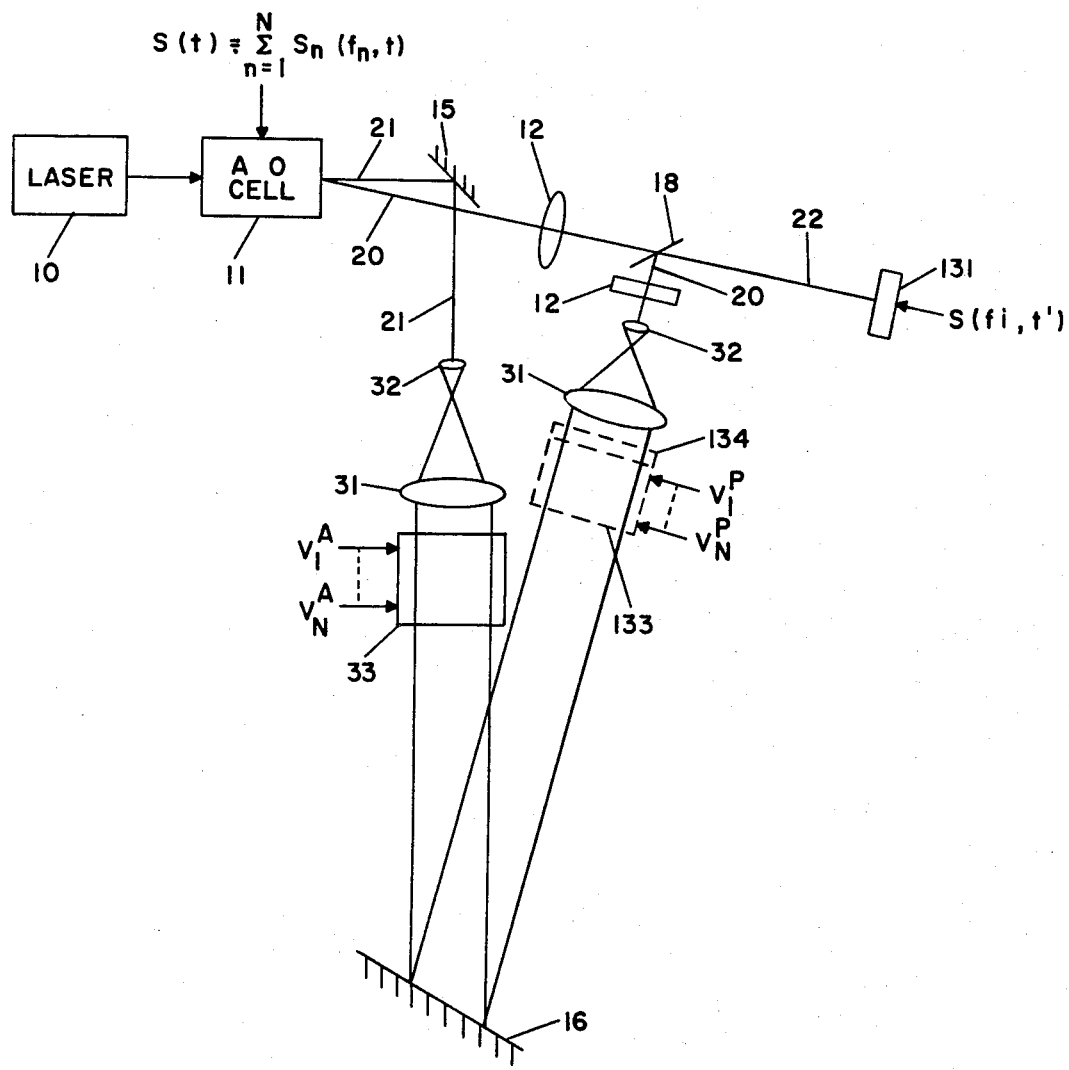
FIG. 2C is a block diagram optically illustrating an alternative embodiment of a rapidly tunable bandpass filter according to the invention using amplitude and phase modulation of the local oscillator beam.

A communications application for the invention illustrated in FIG. 1A is a rapidly tunable bandpass filter in a frequency, time-sharing receiver. Such a structure provides the desirable characteristics of rapid tunability without energy storage effects, high out-of-passband rejection and wide dynamic range. FIGS. 2A, 2B and 2C illustrate three embodiments of this aspect of the invention.

FIG. 2A illustrates a channelized receiver which is functionally equivalent to a set of contiguous filters with channel selecting circuitry and an RF combiner. The channelized receiver portion of the system is accomplished acousto-optically with the structure as shown in FIG. 1A. FIG. 2A shows a linear photomixer array 13 which is uniformly illuminated with the local oscillator LO. Photomixer sections 13a, 13b, 13c, ... 13n are arranged along the frequency axis of the rear focal plane of spherical Fourier Transform lens 17. Therefore, each section of the photomixer provides an output 23a, 23b, 23c, ... 23n which corresponds to that of a contiguous bandpass filter and is applied through its corresponding RF switch 24a, 24b, 24c, ... 24n with associated control for input into summer 25. This results in the channelized receiver 13, together with the external channel selecting RF circuitry 24 and the RF combiner 25, forming a filter which is tuned by the controls associated with switches 24a, ... 24n.

FIG. 2B illustrates an embodiment of the invention wherein the tuning is accomplished with optics rather than external RF circuitry 24 as shown in FIG. 2A. The signal S(t) to be detected is converted by cell 11 to corresponding bulk waves which interact with light from laser 10. However, the resulting diffracted light 20 is not detected by an array. Specifically, a single extended photodetector 131 of sufficient bandwidth and size to intercept and detect all diffracted beams 20, undiffracted beam 21 and the frequency difference therebetween is used for detection. The photomixer 131 is not uniformly illuminated by a local oscillator beam LO as in the FIG. 1A embodiment. In contrast, the local oscillator beam is focused to a spot LOS by spherical lens 121. Beam deflector 24 (such as disclosed in copending application Ser. No. 274,577 filed June 17, 1981 concurrently herewith) is used to translate the spot across the photomixer 131 along the frequency axis by adjusting the control voltage 25. As a result, heterodyning, as discussed above with regard to FIG. 1A, occurs only where the diffracted beams 20 and local oscillator spot LOS overlap. Alternatively, rapid local oscillator spot LOS translation (i.e., rapid tuning) in the submicrosecond range may be achieved by using the acousto-optical or electro-optical deflection techniques illustrated in copending application Ser. No. 274,577 filed June 17, 1981 concurrently herewith.

The tuning speed of the FIG. 2B embodiment is constrained by the deflection bandwidth of beam deflector 124. The deflection bandwidth of the acousto-optical techniques as disclosed in copending Ser. No. 274,577 is approximately equal to the inverse of the acoustic beam travel time across the incident optical beam. This travel time is usually on the order of fractions of a microsecond. Therefore, tuning speeds less than a microsecond are obtainable using the structure illustrated in FIG. 2B. In electro-optical beam deflection as disclosed in copending Ser. No. 274,577, the spatial refractive index gradient is generated by an electric field. This field results from the voltage applied to opposite metalized surfaces of the crystal. The capacitance encountered, which can range from 10 to 1000 microfarads, limits the beam deflection rate. As the desired deflection rate increases, the power necessary to charge and discharge the capacitance eventually becomes excessive. In addition, prior art attempts at using electro-optical light deflection have demonstrated flat frequency responses only up to about 100 KHz. However, this limit applied to systems having about one thousand resolvable spots. The number of resolvable spots is proportional to the maximum electric field swing, which is proportional to the square root of the drive power. By reducing the number of desired spots a dramatic decrease in the necessary drive power will result with an attendant increase in the maximum beam deflection frequency. Therefore, submicrosecond deflection speeds are achievable when deflector 124 is an electro-optical device.

Figure 3A:
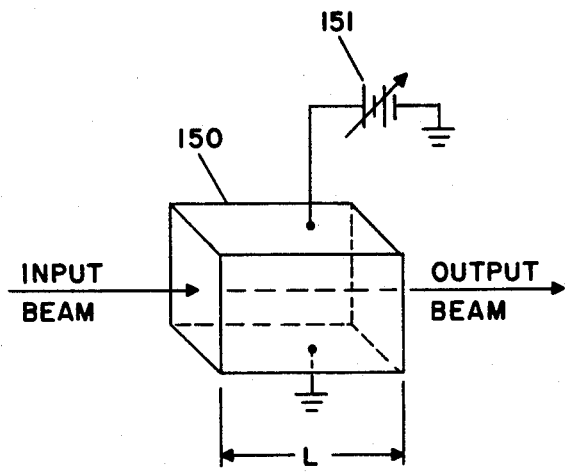
FIGS. 3A and 3B illustrate electro-optical modulators.
Figure 3B:
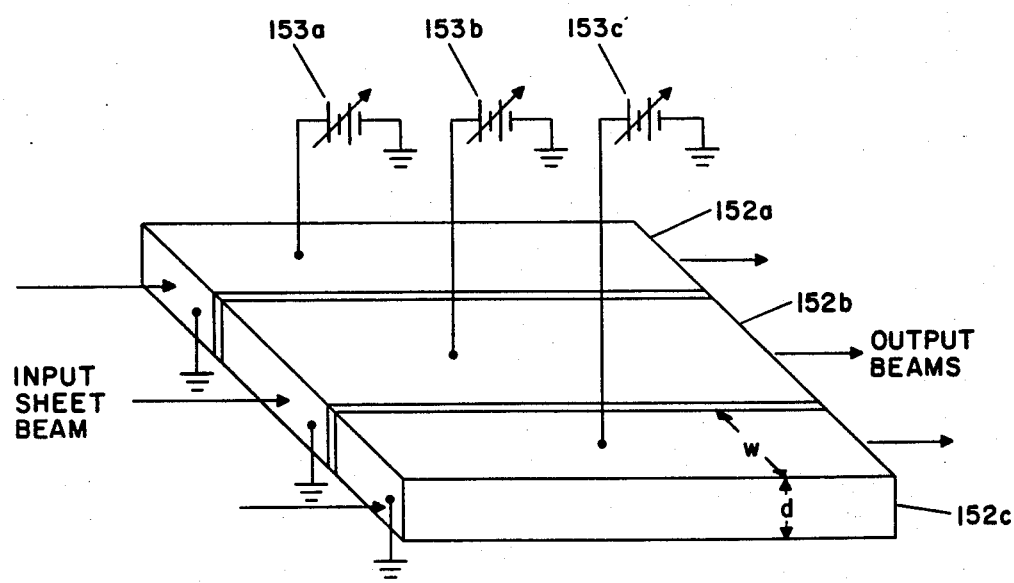

FIG. 3A illustrates a prior art modulator which utilizes the transverse electro-optical effect. FIG. 3B illustrates a channelized embodiment of the FIG. 3A embodiment. By keeping the ratio W/D large, the effects of unwanted modulation at channel interfaces may be minimized. In electro-optical amplitude modulation, an applied electric field is used to gradually rotate the polarization vector of the light. This effect occurs for appropriate crystal cuts and amplitude modulation occurs if a polarizer is placed after the electro-optical crystal. Amplitude modulation is accomplished acousto-optically using bulk wave Bragg interaction while the excitation voltage is varied. The intensity of the first order diffracted beam is given by:

$$I_1 = I_o \sin^2 \frac{\pi}{\lambda} [\sqrt{(MLP_a/2H)}\,]$$

where
$I_1$ = intensity of first order beam,
$I_0$ = intensity of incident beam,
$M$ = acousto-optical figure of merit,
$P_a$ = acoustic power in interaction region,
$L$ = interaction length,
$H$ = acoustic column width,
$\lambda$ = optical wavelength.

For a channelized local oscillator sheet beam, a contiguous array of acoustic transducers whose acoustic beams were illuminated with a uniform laser beam would be used. The transducers would be driven with the same convenient frequency and would be individually amplitude modulated.

Specifically, FIG. 3A illustrates an electro-optical crystal 150 subjected to a variable potential difference 151 thereby modulating the variable difference onto the input beam. In FIG. 3B, an input sheet beam is applied to a plurality of electro-optical crystals 152a, 152b, 152c, each of which has a variable potential difference 153a, 153b, 153c, respectively, applied thereto.

A characteristic inherent in acousto-optical Bragg diffraction of the local oscillator is that the local oscillator is frequency shifted by the excitation frequency of the Bragg cell. For example, if the overall device is a channelized filter the effect is to frequency shift all the frequency bins. On the other hand, electro-acoustical modulation and beam deflection as discussed in copending application Ser. No. 274,577 do not result in frequency shifting of the incoming light.

FIG. 2C is another embodiment of the invention employed as a rapidly tunable bandpass filter. Single extended photomixer 131 is used in combination with a local oscillator beam shaped into a sheet beam LO by lenses 31, 32. The sheet beam local oscillator LO illuminates the photomixer 131 and is channelized through an array of contiguous electro-optical beam modulators forming a part of channelized electro-optical cell 33. In order to achieve tuning, the local oscillator channel or channels which are to be "turned on" correspond to the desired filter bandpass of cell 33. This results in extremely high modulation rates.

In FIG. 2C, a channelized receiver with complex weights at each frequency bin may be achieved by locating phase modulator 133 in the local oscillator sheet beam LO path and by replacing photomixer 131 with a photomixer array. Electro-optical phase modulation of beam LO may be achieved in accordance with the structure as illustrated in FIGS. 3A and 3B by varying the refractive index and, therefore, the optical path length of the crystal, by suitable application of an electric field.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. Apparatus for detecting frequency components of a signal comprising:
    (a) first means for converting a supplied signal into corresponding acoustic waves propagating through a medium; and
    (b) second means for optically detecting the frequency components of the corresponding acoustic waves, whereby the frequency components correspond to the components of the signal.

2. The apparatus of claim 1 wherein said first means comprises an acousto-optical cell having a transducer to which the signal is applied and an absorber.

3. The apparatus of claim 2 wherein said second means comprises:
    (a) means for providing coherent light incident upon said cell at an acousto-optical angle;
    (b) a Fourier Transform element for focusing light diffracted by said cell;
    (c) means for focusing undiffracted light from said means for providing; and
    (d) means for detecting the frequency difference between the diffracted light focused by said element and the undiffracted light focused by said second means.

4. The apparatus of claim 3 wherein said means for detecting is a photomixer array for detecting discrete frequency bands.

5. The apparatus of claim 4 wherein said array comprises a monolithic photodetector of discrete, contiguous detecting sections.

6. The apparatus of claim 4 wherein said means for focusing comprises optical elements for forming the undiffracted light into a sheet beam focused on the means for detecting.

7. The apparatus of claim 6 wherein said Fourier Transform element comprises a Fourier Transform lens located in the path of the diffracted light, said lens having a focal length equal to the distance between said lens and said means for detecting.

8. The apparatus of claim 7 wherein said optical elements are lenses and wherein said means for providing is a laser.

9. The apparatus of claim 4 further comprising means for summing the output of each of the sections of said photomixer array and means for selectively interconnecting the outputs of the sections to said means for summing.

10. The apparatus of claim 9 wherein said means for summing comprises a plurality of controlled switches, each having an input connected to one of said photodetector sections and an output connected to a summer.

* * * * *